United States Patent [19]
Lee

[11] Patent Number: 5,400,347
[45] Date of Patent: Mar. 21, 1995

[54] APPARATUS AND METHOD FOR ERROR CORRECTION

[75] Inventor: Yun-woo Lee, Gunpo-city, Rep. of Korea

[73] Assignee: Samsung Electronics Co., Ltd., Kyunggi-do, Rep. of Korea

[21] Appl. No.: 804,418

[22] Filed: Dec. 10, 1991

[30] Foreign Application Priority Data

Aug. 31, 1991 [KR] Rep. of Korea .................. 91-15248

[51] Int. Cl.⁶ .............................................. G06F 11/10
[52] U.S. Cl. ................................. 371/37.5; 371/37.4
[58] Field of Search .............. 371/37.5, 37.1, 37.2, 371/37.3, 37.4, 37.7, 38.1, 39.1, 40.1, 47.1, 25.1, 41, 43

[56] References Cited

U.S. PATENT DOCUMENTS

| | | | |
|---|---|---|---|
| 4,413,340 | 11/1983 | Odaka et al. | 371/39.1 |
| 4,644,544 | 2/1987 | Furuya et al. | 371/37.5 |
| 4,802,172 | 7/1989 | Fukami et al. | 371/38.1 |
| 4,998,252 | 3/1991 | Suzuki et al. | 371/37.5 |
| 5,060,221 | 10/1991 | Sako et al. | 371/37.4 |

Primary Examiner—Robert W. Beausoliel, Jr.
Assistant Examiner—Dieu-Minh Le
Attorney, Agent, or Firm—Leydig, Voit & Mayer

[57] ABSTRACT

An apparatus and method for error correction which interleaves by inner codes two fields in one frame during product-coding which is used to correct burst errors, so as to disperse the errors through the two fields (that is, to at least double the correction ability), thereby preventing the deterioration of picture quality which is caused by the errors being restricted to one field when the burst errors occur. Further, the apparatus and method reduce the deterioration of picture quality by smoothly performing a function of error concealment by preventing error concentration even when the errors occur outside the range of error correction ability.

26 Claims, 10 Drawing Sheets

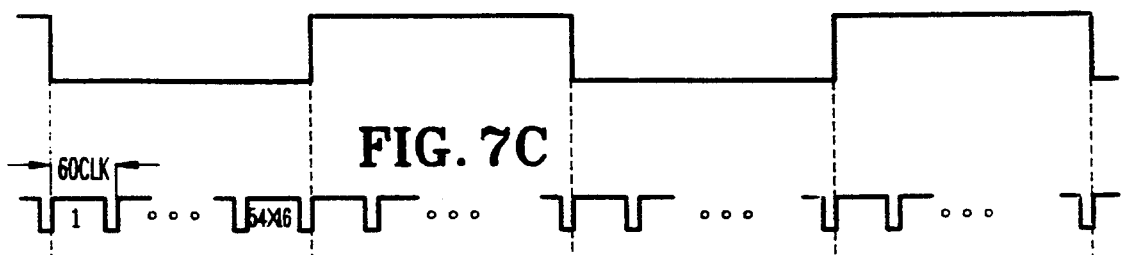
FIG. 7A
FIG. 7B
FIG. 7C
FIG. 7D
FIG. 7E
FIG. 7F
FIG. 7G
FIG. 7H
FIG. 7I
FIG. 7J
FIG. 7K FIG. 10A
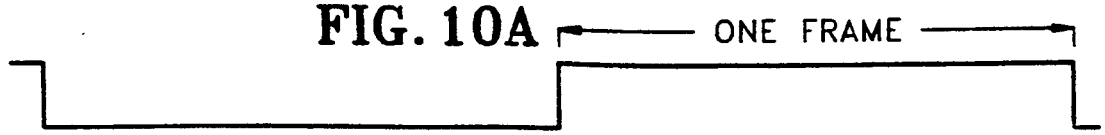
FIG. 10B
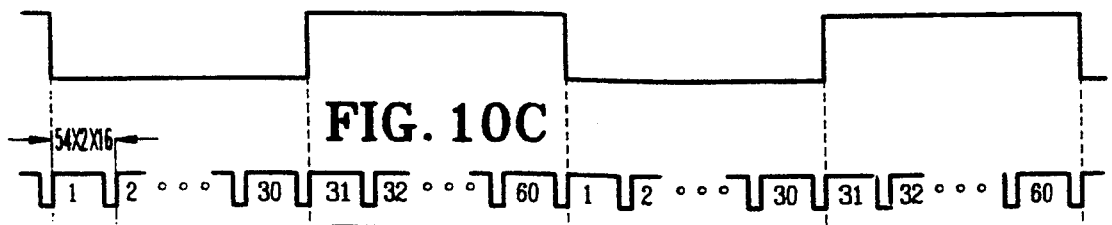
FIG. 10C
FIG. 10D
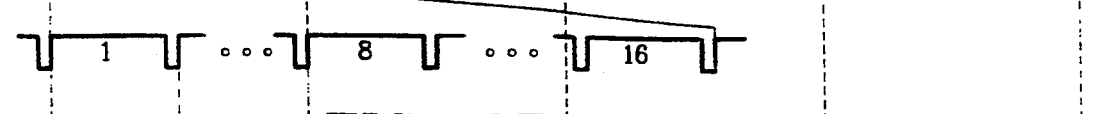
FIG. 10E
FIG. 10F
FIG. 10G
FIG. 10H
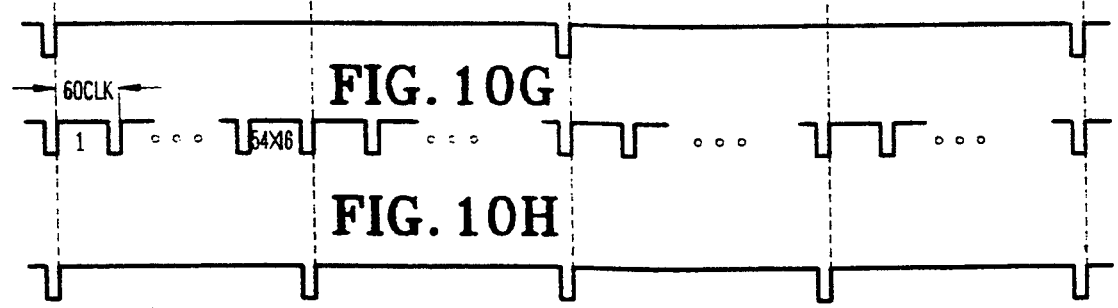
FIG. 10I
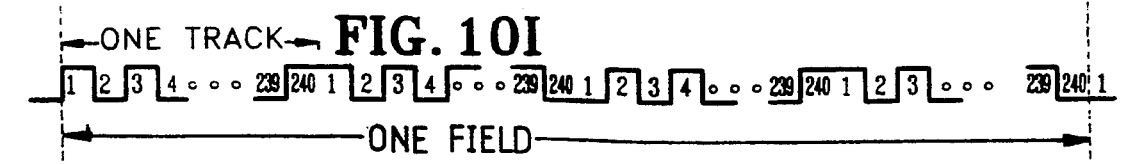
FIG. 10J
FIG. 10K

APPARATUS AND METHOD FOR ERROR CORRECTION

BACKGROUND OF THE INVENTION

The present invention relates to an apparatus and method for error correction in a digital signal record/playback apparatus, and more particularly to an apparatus and method which interleaves two fields by frames so as to improve the burst error correction ability.

Generally, a digital video signal record/playback apparatus uses an encoding technique to compress and encode a great amount of picture information so as to efficiently transmit or store the picture information in digital form.

The encoded picture data is, however, disadvantageous in that errors which may occur during transmission, storage, reception or playback, deteriorate picture quality. In order to make up for this disadvantage of the encoding technique, an error correction encoding technique adds parity data to the picture information during the encoding, so as to correct the errors occurring during transmission, storage, reception or playback and obtain the original picture. Thus, errors are corrected by the usage of parity data.

However, among these errors, random errors occurring sporadically are easy to correct, but burst errors which occur in succession and form error groups are difficult to correct. The burst errors greatly affect picture quality. A product code is broadly used for burst error correction.

Referring to FIG. 1, in order to product-code the input video data (FIG. 2A) during coding, an outer encoder 2 adds parity data $P_0$–$P_5$ in the column direction (FIG. 2B), and an inner encoder 4 adds parity data $P_0$–$P_7$ in the row direction (FIG. 2C). Here, the length of outer code is 60 and the length of inner code is 54. An interleaving unit 3 connected between outer and inner encoders 2 and 4 arranges the video data which includes the horizontal parity data $P_0$–$P_5$ added to its outer code, by fields that is, from left to right and from top to bottom as shown in the odd and even field maps of FIGS. 3A and 3B, and reads out the video data by bytes from top to bottom and from left to right in order for inner encoder 4 to add the parity data shown in FIG. 2C. A modulator 5 converts 8-bit picture information which is error-correction-encoded in inner encoder 4 into N-bit data (10bits). A recording amplifier 6 amplifies the N-bit data to record it on a recording medium 7 such as tape.

Here, FIG. 4 illustrates a format wherein error-correction-encoded picture information is recorded on tape.

As shown in FIG. 4, one field is recorded onto four tracks of a tape. Data A0,0 to A15,14 is recorded on the first track of an odd field, data A0,15 to A15,29 is recorded on the second track of the odd field, data A0,30 to A15,44 is recorded on the third track, and data A0,45 to A15,59 is recorded on its fourth track. Data B0,0 to B15,14 is recorded on the first track of an even field, data B0,15 to B15,29 is recorded on the second track of the even field, data B0,30 to B15,44 is recorded on the third track, and data B0,45 to B15,59 is recorded on its fourth track.

Then, the recorded data is amplified by a reproducing amplifier 8, and a demodulator 9 converts the 10-bit data back into 8-bit serial data during recording. An inner decoder 10 decodes the data output from demodulator 9, and corrects the errors within its error correction ability. The inner decoder adds an error flag to the data having errors outside the range of error correction, and supplies a de-interleaving unit 11 with the result. The de-interleaving unit 11 re-reads out by fields the odd field data A0,0 to A15,59, and even field data B0,0 to B15,59 which is recorded onto four tracks as shown in FIG. 4, so as to output the read-out data to an outer decoder 12.

According to the error flag, outer decoder 12 re-corrects the outer codes of data from de-interleaving unit 11, and outputs the re-corrected outer codes.

An error correction apparatus using a product code is disclosed in Japanese laid-open patent publication No. sho 64-30344. During outer decoding in normal playback and when outer decoding is not performed in high-speed playback, the No. sho 64-30344 error correction apparatus inner-decodes by selecting a decoding algorithm corresponding to each case. This reduces the uncorrectable errors occurring due to inner-code error correction.

However, the error correction ability of the aforementioned error correction apparatus is within A0,0 to A15,5 that is, 54×16×6 bytes per track of a field so that errors outside of the range cannot be corrected. In other words, according to this apparatus, since one field of data is successively recorded onto four tracks of a tape, when a burst error over 54×16×6 bytes occurs, it cannot be efficiently dispersed. This weakened error correction ability deteriorates picture quality.

SUMMARY OF THE INVENTION

Therefore, it is an object of the present invention to provide an error correction apparatus for record/playback of digital signals which improves error correction ability by alternately recording the data of each field by inner code, setting two fields as the interleaving unit during product-coding and interleaving which are performed to enhance the correction ability for burst errors, so as to disperse errors occurring during playback into two fields and correct the errors.

It is another object of the present invention to provide an error correction method for record/playback of digital signals which improves error correction ability by alternately recording the data of each field by inner code, setting two fields as the interleaving unit during product-coding and interleaving, which are performed to enhance the correction ability for burst errors, so as to disperse errors occurring during playback into two fields and correct the errors.

To achieve the above objects, the error correction apparatus of the present invention, in a digital record/playback apparatus for recording compressed data on a recording medium and reproducing the recorded data from the recording medium, includes an outer encoder for adding horizontal parity data to compressed block data. A frame interleaving unit is provided for alternately arranging by inner code, the two fields of data in a frame encoded in the outer encoder. Also included is an inner encoder for adding vertical parity data to the data read out from the frame interleaving unit and transmitting the result to the recording medium. An inner decoder is provided for correcting the errors within the error correction ability among errors in the data reproduced from the recording medium and adding an error flag to the errors outside the range of the error correction ability and outputting the result. Further provided is a frame de-interleaving unit for detecting a corresponding field of data which is alternately recorded by inner codes while divided into two fields and output from the inner decoder, and arranging the detected data by fields. Lastly, an outer decoder for is included re-correcting the errors of outer codes to which an error flag is added among data read out by fields from the frame de-interleaving unit Steps to achieve the error correction method of the present invention in a digital signal record/playback apparatus, comprise: an outer encoding step of adding horizontal parity data to compressed block data, a frame interleaving step of alternately arranging two fields of data by inner codes from one frame of data which is encoded in the outer encoding step, an inner encoding step of adding vertical parity data to data read out from the frame interleaving step to transmit the data to a recording medium, an inner decoding step of correcting the errors within the error correction ability among errors in the data reproduced from the recording medium and adding an error flag to the errors outside the range of the error correction ability, a frame de-interleaving step of detecting a corresponding field of data which is divided into inner codes and output from the inner decoding step so as to arrange the data by fields, and an outer decoding step of correcting outer codes to which the error flag is added, among data read out by fields from the frame de-interleaving step.

BRIEF DESCRIPTION OF THE DRAWINGS

The above objects and other advantages of the present invention will become more apparent by describing in detail a preferred embodiment of the present invention with reference to the attached drawings in which:

FIGS. 7A-7K illustrate waveforms of the frame interleaving unit of FIG. 6;

FIGS. 10A-10K illustrate waveforms of the frame de-interleaving unit of FIG. 9.

DETAILED DESCRIPTION OF THE INVENTION

Figure 5:
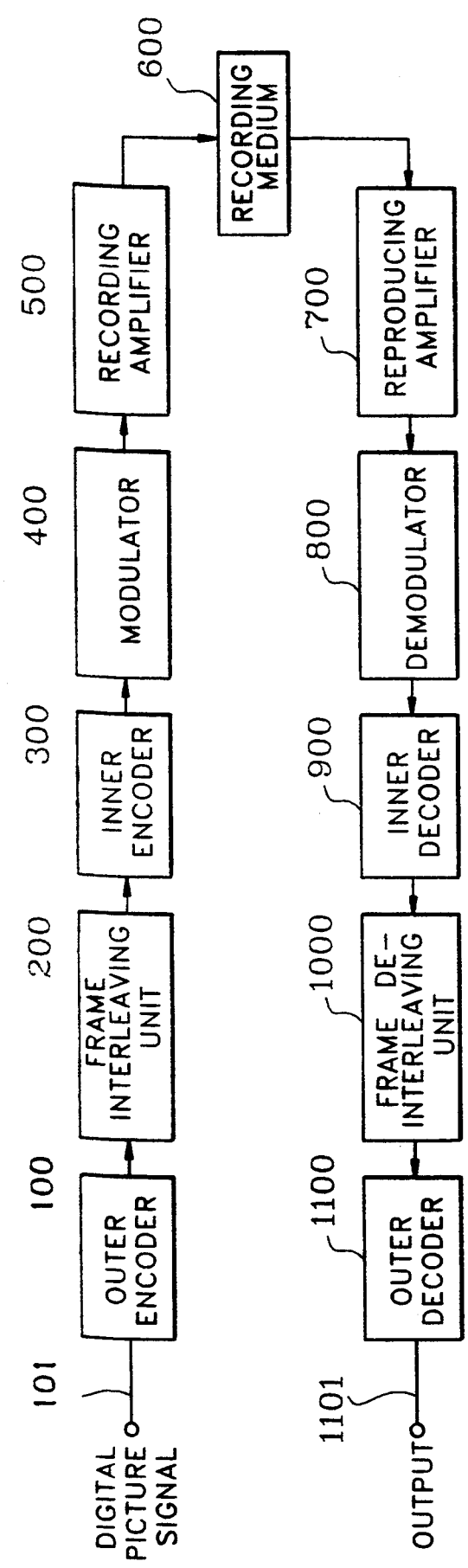
FIG. 5 is a block diagram of an embodiment of an error correction apparatus according to the present invention.

Referring to FIG. 5, an outer encoder 100 adds horizontal parity data to a digital picture signal input through an input port 101.

Here, the output of an analog-to-digital (A/D) converter (not shown) which converts a video signal from the signal source into a digital video signal, is connected to a data compressor (not shown) for discrete-cosine-transforming the data output from the A/D converter into one-dimensionally compressed data and two-dimensionally re-compressed data using Huffman's encoding method and the data compressor is connected to input port 101.

A frame interleaving unit 200 reads out odd and even field data by inner codes. This data is coded in outer encoder 100 so as to alternately arrange the read out data. An inner encoder 300 adds vertical parity data to the data where odd and even fields are interleaved and output from frame interleaving unit 200 so as to sequentially transmit the error correction coded picture information by bytes from top to bottom and from left to right. A modulator 400 converts 8-bit data to high-frequency component data (10 bits) to compensate for the high error rate of a low-frequency signal transmitted from inner encoder 300. A recording amplifier 500 amplifies the modulated signal from modulator 400 so that it may be recorded on a recording medium 600.

A reproducing amplifier 700 reproduces a signal recorded on the recording medium 600 by way of a reproducing head (not shown), and in doing so, amplifies the signal. To convert the 10-bit serial data amplified in reproducing amplifier 700 back into the original frequency band, a demodulator 800 converts the serial data into 8-bit parallel data. When errors occur in the demodulated data from demodulator 800, an inner encoder 900 corrects the errors within its error correction ability, adds an error flag to those errors outside its range of error correction ability, and transmits the errors to a frame de-interleaving unit 1000. The frame de-interleaving unit 1000 detects data output from inner encoder 900 to be stored together with an error flag by fields and transmit them to an outer decoder 1100 by outer codes. The outer decoder 1100 corrects errors in the data transmitted with the error flag from frame de-interleaving unit 1000 so as to output the corrected data to an error concealment unit (not shown) for concealing errors which is connected to an output port 1101.

Figure 6:
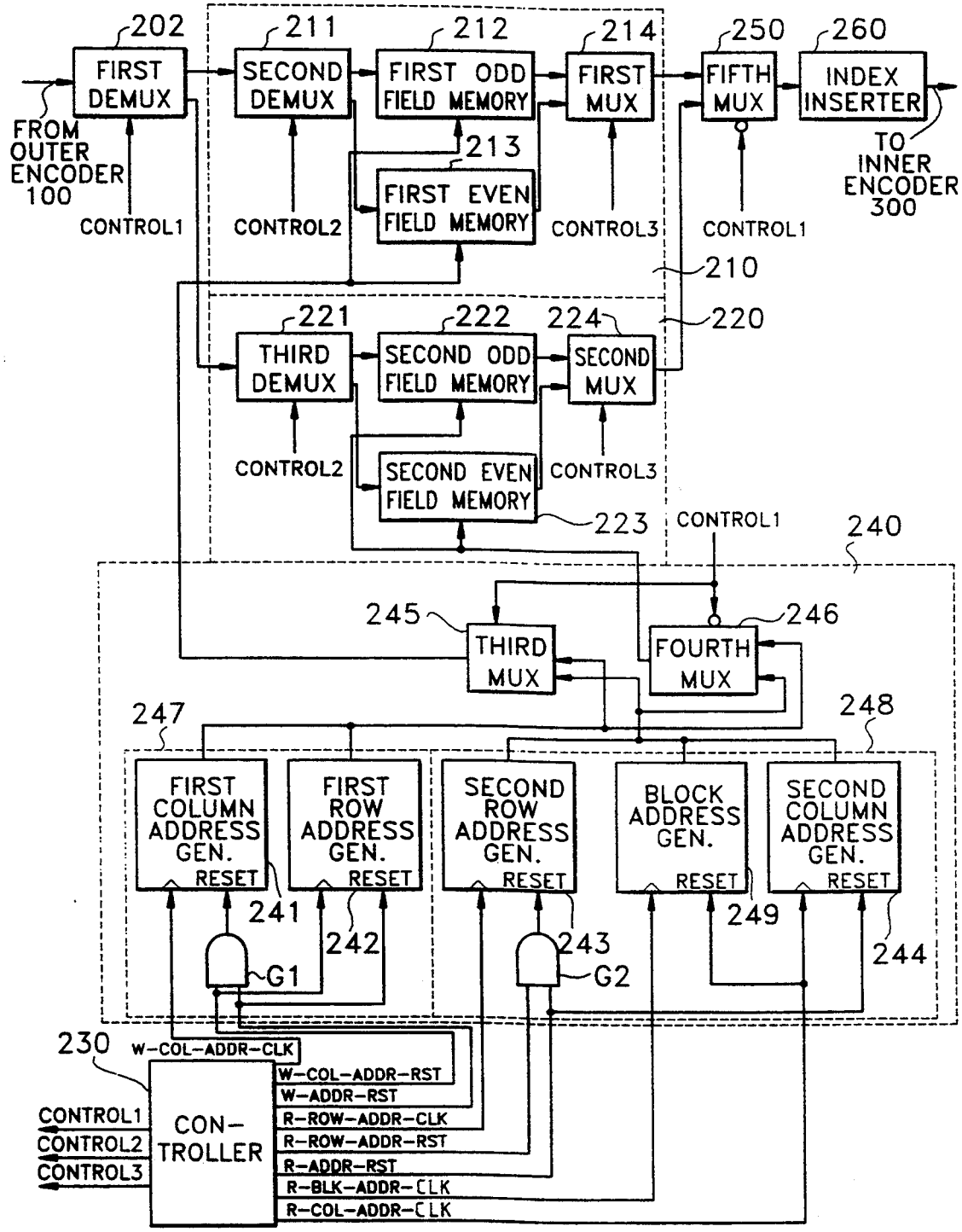
FIG. 6 is a detailed circuit diagram of the interleaving unit of FIG. 5.

Referring to FIG. 6, a first demultiplexer 202 receives its input from outer encoder 100 of FIG. 5. A second demultiplexer 211 has its input connected to a first output of first demultiplexer 202, a first output connected to a first odd field memory 212, and a second output connected to a first even field memory 213. A first input of a first multiplexer 214 is connected to the output of the first odd field memory 212, while a second input thereof is connected to the output of first even field memory 213, and its output is connected to a first input of a fifth multiplexer 250. A third demultiplexer 221 has its input connected to a second output of first demultiplexer 202, a first output connected to a second odd field memory 222, and a second output connected to a second even field memory 223. A first input port of second multiplexer 224 is connected to the output of the second odd field memory 222, while a second input is connected to the output of second even field memory 223, and its output is connected to a second input of fifth multiplexer 250.

Here, a first frame memory 210 consists of second demultiplexer 211, first odd field memory 212, first even field memory 213, and first multiplexer 214. A second frame memory 220 consists of third demultiplexer 221, second odd field memory 222, second even field memory 223, and second multiplexer 224.

The input of an index inserter 260 is connected to the output of fifth multiplexer 250, while its output feeds the input of inner encoder 300 of FIG. 5.

A first control signal output port CONTROL1 of a controller 230 is connected to select ports of first demultiplexer 202 and third multiplexer 245, and to inverted select ports of fourth and fifth multiplexers 246 and 250. A second control signal output port CONTROL2 is connected to select ports of second and third demultiplexers 211 and 221, and a third control signal output port CONTROL3 is connected to select ports of the first and second multiplexers 214 and 224. A write column address clock port W-COL-ADDR-CLK is connected to the clock input of a first column address generator 241. Write column address reset port W-COL-ADDR-RST and write address reset port W-ADDR-RST are respectively connected to input ports of a first AND gate G1. A read row address clock port R-ROW-ADDR-CLK is connected to the clock input of a second row address generator 243, and read row address reset port R-ROW-ADDR RST and read address reset port R-ADDR-RST are respectively connected to the input ports of a second AND gate G2.

The reset port of a first column address generator 241 is connected to the output of first AND gate G1. The output of first column address generator 241 is connected to first input ports of third and fourth multiplexers 245 and 246. The clock input of a first row address generator 242 is also connected to write column address reset port W-COL-RST of controller 230, while its reset port is connected to the write address reset port W-ADDR-RST of controller 230. The output of first row address generator 242 is also connected to the first input ports of third and fourth multiplexers 245 and 246.

Here, a write address generator 247 consists of first column address generator 241, first row address generator 242 and first AND gate G1.

The reset port of a second row address generator 243 is connected to the output of second AND gate G2. The output of second row address generator 243 is connected to second input ports of third and fourth multiplexers 245 and 246. The clock input of a block address generator 249 is connected to read block address clock R-BLK-ADDR-CLK of controller 230, while its reset port is connected to read column address clock R-COL-ADDR-CLK of controller 230. The output of block address generator 249 is connected to the second inputs of third and fourth multiplexers 245 and 246. The clock input of second column address generator 244 is also connected to read column address clock R-COL-ADDR-CLK of controller 230, while its a reset port is connected to the read address reset port R-ADDR-RST of controller 230. The output of second column address generator 244 is also connected to the second input ports of third and fourth multiplexers 245 and 246.

Here, a read address generator 248 consists of second row address generator 243, block address generator 249, second column address generator 244 and second AND gate G2.

The output of third multiplexer 245 is connected to address ports of first odd field memory 212 and first even field memory 213. The output of fourth multiplexer 246 is connected to address ports of second odd field memory 222 and second even field memory 223.

Operation of FIG. 6 will be described with reference to FIG. 7.

Referring to FIG. 6, the first control signal CONTROL1 shown in FIG. 7A and output from controller 230 is input to a select port of first demultiplexer 202. This selects one of two frame memories, first and second frame memories 210 and 220, designating one frame memory to record by frames horizontal-parity-data which is output from outer encoder 100 of FIG. 5, and the other to read out the recorded data. When the logic state of first control signal CONTROL1 is "LOW", the first frame memory 210 is selected to record data. When the logic state of first control signal CONTROL1 is "HIGH", the second frame memory 220 is selected to record data.

For instance, when first frame memory 210 is selected while the logic state of first control signal CONTROL1 is "LOW", one frame of data transmitted from first demultiplexer 202 is sequentially recorded into the first odd and even field memories 212 and 213 via second demultiplexer 211 according to the logic state of a second control signal CONTROL2 shown in FIG. 7B.

To be specific, first odd field memory 212 is selected when the second control signal CONTROL2 is "LOW", and when it is "HIGH", first even field memory 213 is selected.

Address generator 240 supplies read/write addresses to first and second frame memories 210 and 220. At the end of the recording of one frame of data recorded into first frame memory 210, which is exactly when the next frame of data starts being recorded into the second frame memory 220, the previously recorded data begins to be read out from the first frame memory 210. The two frame memories record and read out in turn.

From here on, operation of address generator 240 will be described, together with the operation of frame interleaving unit 200 during recording of data into the frame memories and during data read out.

Figure 1:
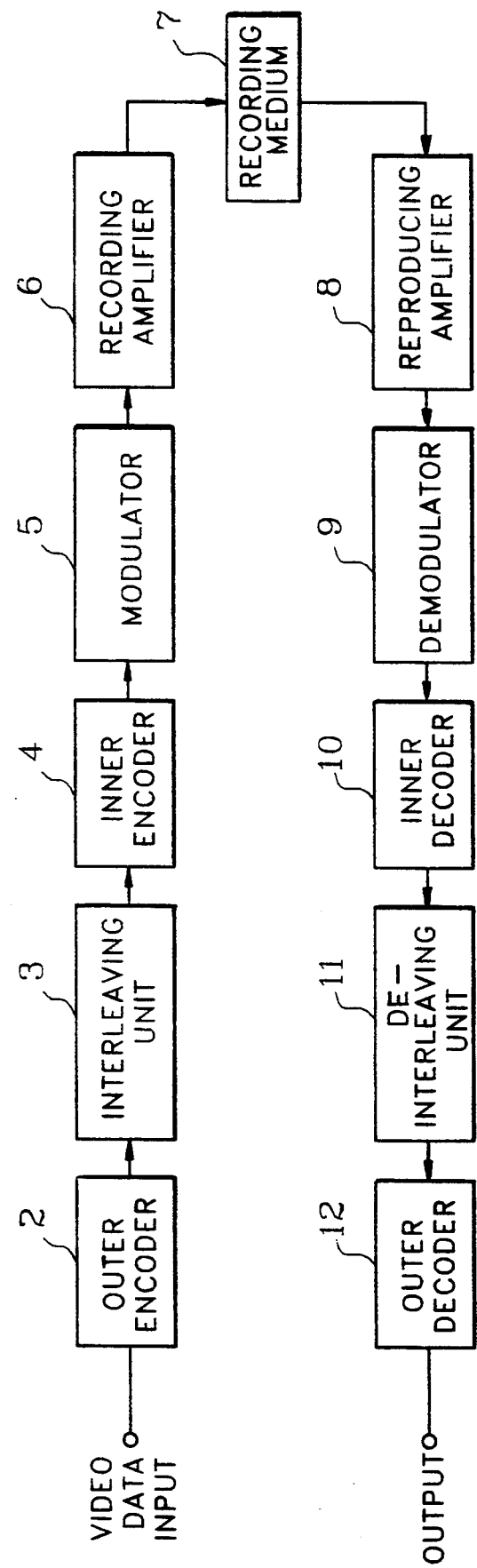
FIG. 1 is a block diagram of a conventional error correction apparatus.
Figure 2A:
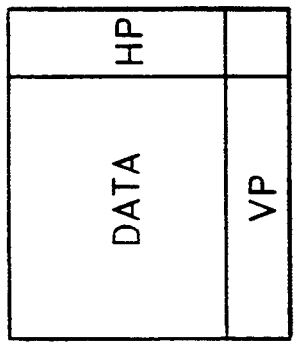
FIG. 2A illustrates a product code.
Figure 2B:
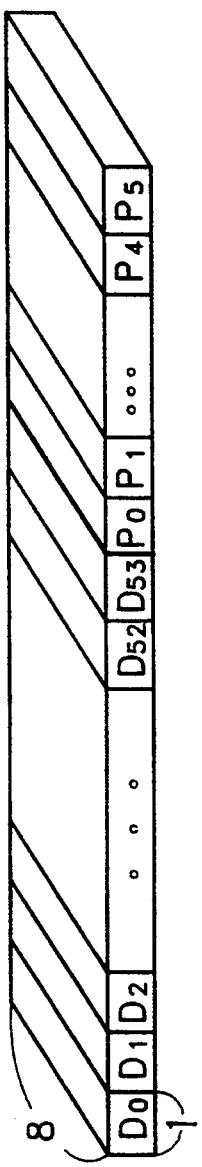
FIG. 2B illustrates the code format of the outer code of FIG. 2A.
Figure 2C:
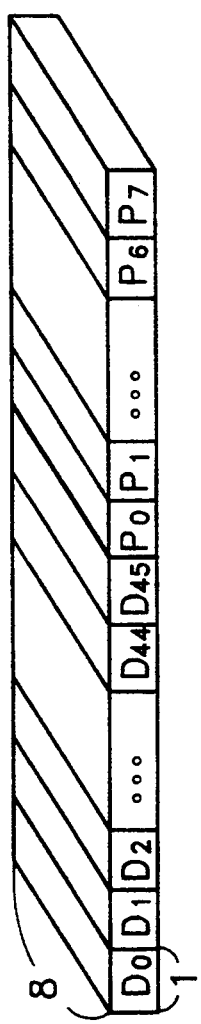
FIG. 2C illustrates the code format of the inner code of FIG. 2A.
Figure 3A:
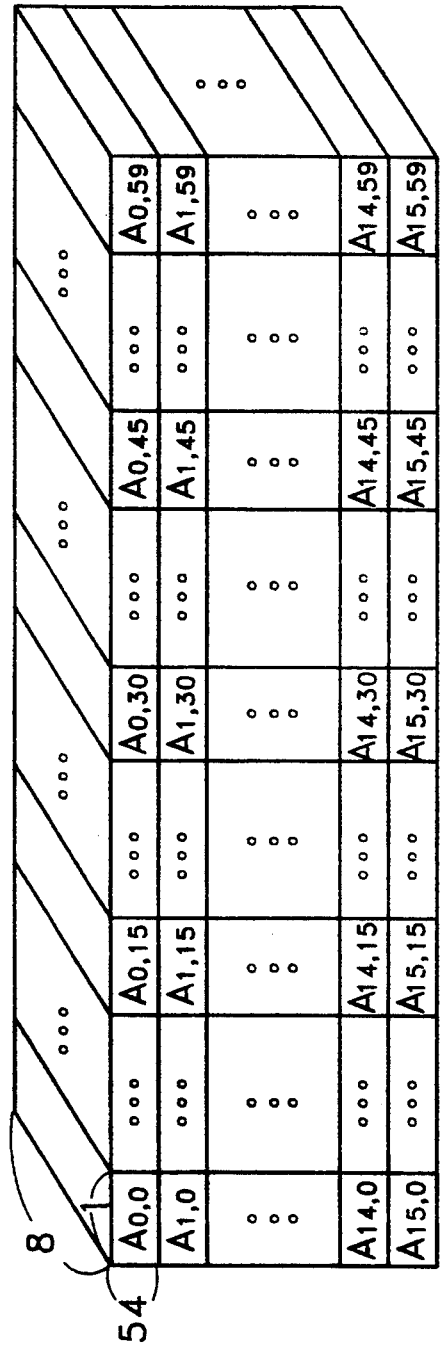
FIG. 3A is an odd field interleaving map according to FIG. 1.
Figure 3B:
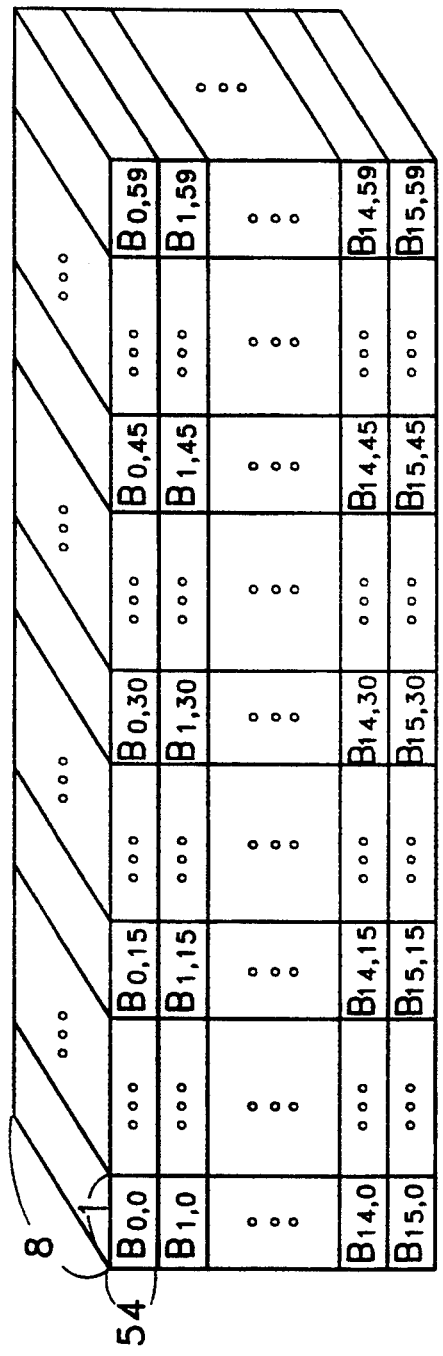
FIG. 3B is an even field interleaving map according to FIG. 1.
Figure 4:
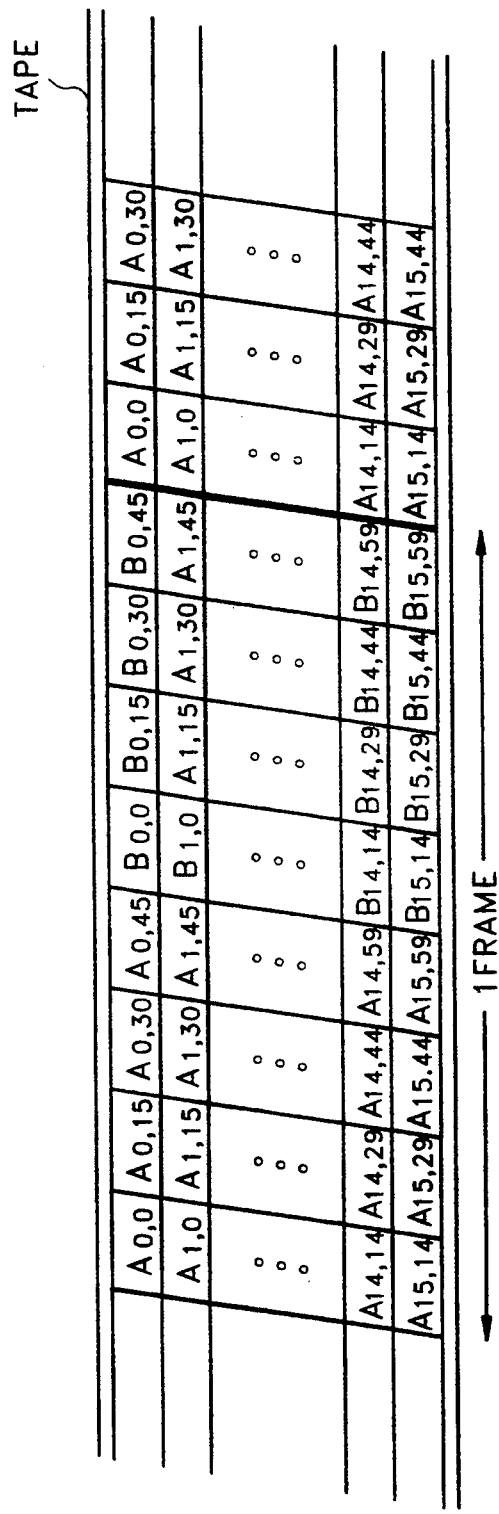
FIG. 4 illustrates the recorded tape format of the interleaving unit in FIG. 1.

When data is recorded into a memory, ascending read addresses begin with the column addresses. That is, first column address generator 241 of write address generator 247 increases the addresses from 0 to 59 and then is reset. This corresponds to the length of the outer code of FIG. 2B. The signal which resets the column addresses is output from controller 230 as the write column address reset signal W-COL-ADDR-RST shown in FIG. 7C. This signal is also used as the clock signal for first row address generator 242 so as to increase the row addresses from 0 to 54×16−1. This corresponds to the entire number of the inner codes (54×16).

The signal shown in FIG. 7D is the write address reset signal W-ADDR-RST whose period equals the field period. This signal resets the first row address generator 242. Write addresses increase sequentially during one field. The sequentially increased column and row addresses are reset every field according to the write address reset signal.

The row and column addresses generated from first row and column address generators 241 and 242 are supplied as write addresses to address ports of first odd and even field memories 212 and 213, and second odd and even memories 222 and 223 via third and fourth multiplexers 245 and 246.

When data is read out from frame memories, read addresses increase starting with the row addresses. In other words, second row address generator 243 of read address generator 248 increases the row address by the length of inner code 54 according to read row address clock pulse R-ROW-ADDR-CLK. For every inner code, second row address generator 243 is reset by read row address reset signal R-ROW-ADDR-RST shown in FIG. 7H.

Addresses of block address generator 249 increase by one for every two inner codes. The clock used for this is the read block address clock signal R-BLK-ADDR-CLK of FIG. 7G which increases addresses from 0 to 15. The signal shown in FIG. 7F resets the output signal of block address generator 249.

Column addresses of second column address generator 244 increase by one for the entire number of inner codes $54 \times 2 \times 16$. The clock is the read column address clock signal R-COL-ADDR-CLK of FIG. 7F used to generate addresses for one outer code (from 0 to 59). The signal shown in FIG. 7E is the read address reset signal R-ADDR-RST whose period equals the frame period and resets the output of second column address generator 244.

Contrary to the write address shown in FIG. 7J, two identical read addresses shown in FIG. 7K are generated for every two adjacent inner codes (even and odd), because during data reading, data of odd and even field memories is alternately read out in units of inner codes with the same address by first and second multiplexers 214 and 215 according to second control signal CONTROL2 shown in FIG. 7I, though during data writing, addresses increase sequentially because data is written in units of fields.

Figure 8:
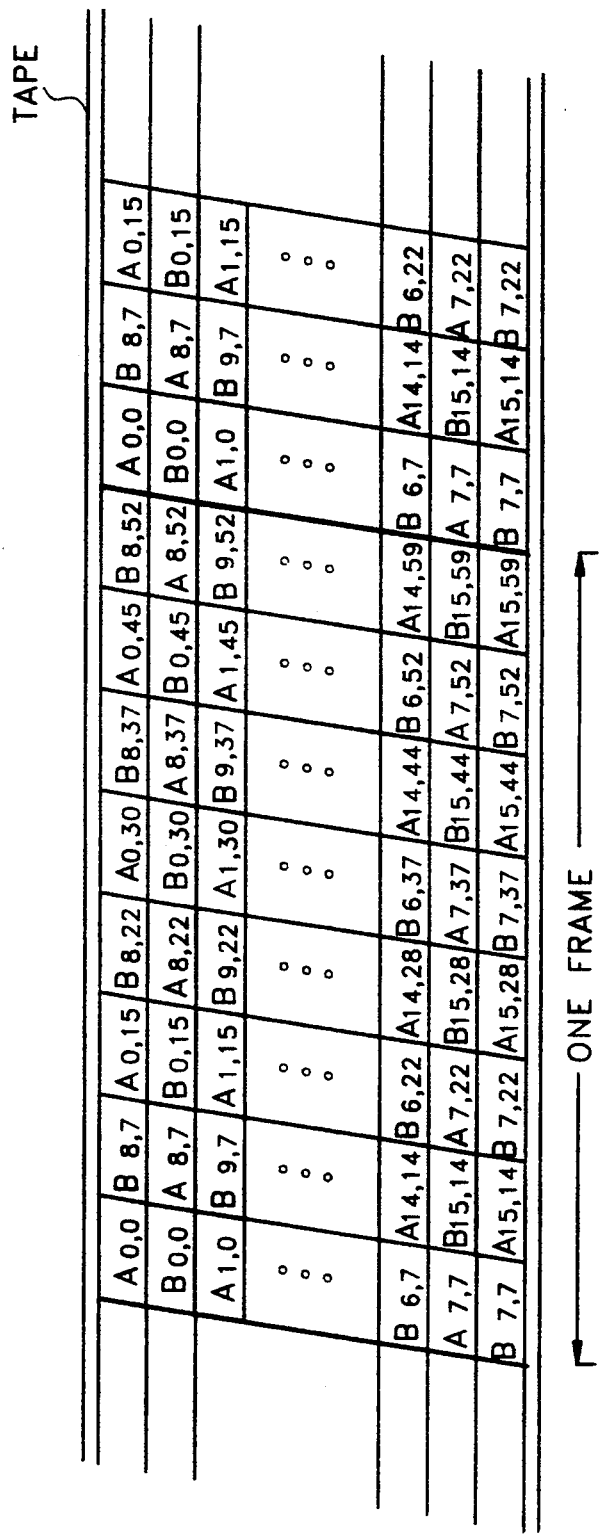
FIG. 8 is the recorded tape format of the frame interleaving unit in FIG. 5.

FIG. 8 shows a format wherein data is read out from first and second frame memories 210 and 220 of frame interleaving unit 200.

Referring to FIG. 8, one field has four tracks, and data of odd and even field memories is alternately recorded by inner codes. So $54 \times 16 \times 60 \times 2$ bytes of data is recorded into one frame. When data is recorded according to the above method and then transmitted alternately by being read out by inner codes from each field, $54 \times 16 \times 12$ byte errors can be corrected. That means that when errors occur, the errors are divided into two fields during the playback process which will be described later, thereby halving the error rate in one field.

Figure 9:
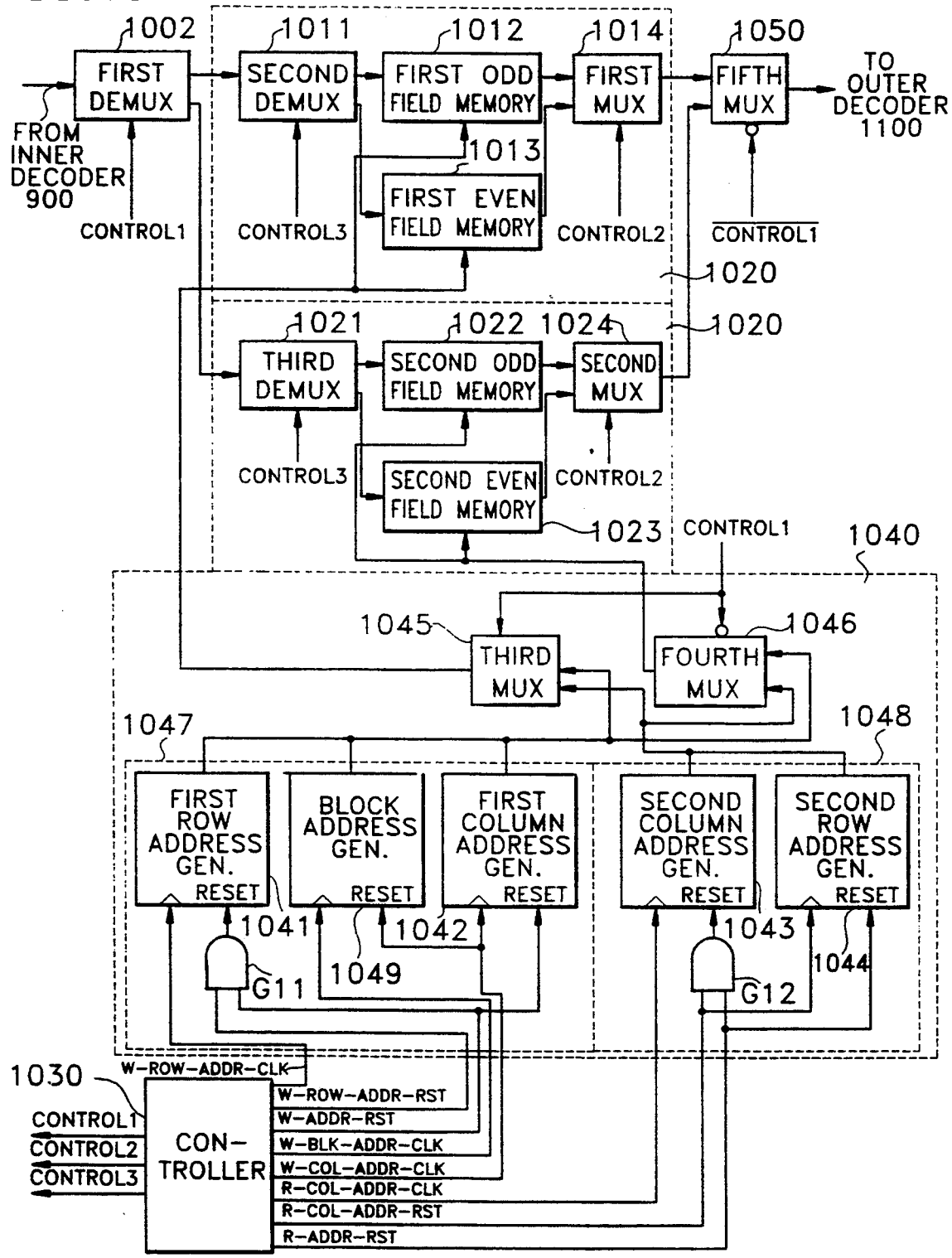
FIG. 9 is a detailed circuit diagram of the frame de-interleaving unit of FIG. 5.

Referring to FIG. 9, the input of a first demultiplexer 1002 is connected to the output of inner decoder 900 of FIG. 5. A third control signal CONTROL3 is input to select ports of second and third demultiplexers 1011 and 1021, a second control signal CONTROL2 is input to select ports of first and second multiplexers 1014 and 1024. The output of a fifth multiplexer 1050 is connected to the input of outer decoder 1100 of FIG. 5. Here, frame de-interleaving unit 1000 has almost the same structure as frame interleaving unit 200 (FIG. 6), except in the connections of the address generators.

First and second input ports of a first AND gate G11 of address generator 1040 are connected to a write row address reset port W-ROW-ADDR-RST and a write address reset port W-ADDR-RST of a controller 1030, respectively. The clock input of a first row address generator 1041 is connected to a write row address clock port W-ROW-ADDR-CLK of controller 1030, while its reset port is connected to the output of first AND gate G11, and its output is connected to the first input ports of third and fourth multiplexers 1045 and 1046. The clock input of block address generator 1049 is connected to write block address clock W-BLK-ADDR-CLK of controller 1030, while its reset port is connected to write column address clock W-COL-ADDR-CLK of controller 1030. The output of block address generator 1049 is connected to the first inputs of third and fourth multiplexers 1045 and 1046. The clock input of a first column address generator 1042 is also connected to write column address clock W-COL-ADDR-CLK, while its reset port is connected to a write address reset port W-ADDR-RST of controller 1030, and its output is connected to first input ports of the third and fourth multiplexers 1045 and 1046.

Here, a write address generator 1047 consists of first row address generator 1041, block address generator 1049, first column address generator 1042, and first AND gate G11.

First and second input ports of a second AND gate G12 are connected to a read row address reset port R-COL-ADDR-RST and a read address reset port R-ADDR-RST of controller 1030, respectively. The clock input of a second column address generator 1043 is connected to a read row address clock port R-COL-ADDR-CLK of controller 1030, while its reset port is connected to the output of second AND gate G12, and its output is connected to second input ports of third and fourth multiplexers 1045 and 1046. The clock input of second row address generator 1044 is also connected to read column address reset port R-COL-ADDR-RST of controller 1030, while its reset port is connected to a read address reset port R-ADDR-RST of controller 1030, and its output is connected to second input ports of third and fourth multiplexers 1045 and 1046.

Here, a read address generator 1048 consists of second column address generator 1043, second row address generator 1044 and second AND gate G12.

From here on, operation of the circuit shown in FIG. 9 will be described with reference to FIGS. 10A–10K.

Referring to FIG. 9, when the logic state of the first control signal CONTROL1 shown in FIG. 10A is "LOW", first frame memory 1010 is selected to write data which is output from inner decoder 900 of FIG. 5, and which is recorded in the format of FIG. 8. When the first control signal is "HIGH", second frame memory 1020 is selected to write the data output from inner decoder 900.

For example, when the logic state of first control signal CONTROL1 of FIG. 10A is "LOW", data transmitted from the first demultiplexer 1002 is alternately recorded into the first odd and even field memories 1012 and 1013 by inner codes through second demultiplexer 1011, which is controlled by the third control signal of FIG. 10I input to the second demultiplexer 1011.

Here, the addresses of write address generator 1047 of the address generator 1040 increase starting from the row addresses. The row addresses increase by an inner code (54) in the first row address generator 1041, and is reset every inner code. The output signal from and gate G11, which has write and write address reset signal as inputs, W-ROW-ADDR-RST is used as a reset signal for row address generator 1041. Address of block address generator 1049 increase by one for every two inner codes. The clock used for this is the write block address clock signal W-BLK-ADDR-CLK of FIG. 10D which increase addresses from 0 to 15. The signal shown in FIG. 10C resets the output signal of block address generator 1049. Column addresses increase by one for the entire number of inner codes ($54 \times 2 \times 16$) in the first column address generator 1042. The clock used for this is the write column address clock signal W-COL-ADDR-CLK of FIG. 10C which increases addresses by outer codes each of which is from 0 to 59.

The signal shown in FIG. 10F is the write address reset signal W-ADDR-RST of the first column address generator 1042 whose period equals the frame period.

Two identical write addresses are generated from the write address generator 1047 for every two adjacent inner codes (even and odd) of FIG. 10K. Th is because data of odd and even fields is alternately written into field memories with the same address in units of inner codes as odd and even field data from one frame. Data is alternately recorded by inner codes as shown in FIG. 8.

Read addresses used when data is read out from first odd and even field memories 1012 and 1013, increase starting with the column addresses. The column addresses increase by one outer code in second column address generator 1043 and are reset by the output signal of and gate G12 which has the read column address reset signal R-COL-ADDR-RST shown in FIG. 10G and the read address reset signal R-ADDR-RST as inputs. The read column address reset signal which is also used as the clock for row address generator 1048 to increase row addresses by the number of inner codes (54×16).

Read addresses output from read address generator 1048 increase sequentially as shown in FIG. 10J.

The increased column and row addresses are reset every field by the read address reset signal R-ADDR-RST shown in FIG. 10H. Thus, first multiplexer 1014 selects first odd field memory 1012 when the second control signal CONTROL2 of FIG. 10B is "LOW" and selects first even field memory 1013 when the second control signal CONTROL2 is "HIGH". This transmits data stored in first odd or even field memories 1012 and 1013 to fifth multiplexer 1050 which reads out fields of data to be transmitted to outer decoder 1100.

As described above in detail, the apparatus and method for error correction of the present invention alternately interleaves two fields in one frame in units of inner codes. consequently the errors are dispersed over the two fields (that is, error correction ability is at least doubled), thereby preventing the deterioration of picture quality which is caused by limiting the errors in one field when the burst errors occur. Further, the present invention prevents the deterioration of picture quality by smoothly performing a function of error concealment by preventing error concentration even when errors occur outside of the range of error correction ability.

While the invention has been particularly shown and described with reference to preferred embodiments thereof, it will be understood by those skilled in the art that various changes in form and details may be made therein without departing from the spirit and scope of the invention as defined by the appended claims.

What is claimed is:

1. An error correction apparatus for use in a digital record/playback apparatus for recording compressed data on a recording medium and reproducing the recorded data from said recording medium, comprising:
    an outer encoder for adding horizontal parity data to compressed block data and encoding a frame;
    a frame interleaving means for alternately arranging in units of inner codes two fields of data in a frame encoded in said outer encoder;
    an inner encoder for adding vertical parity data to the data read out from said frame interleaving means and transmitting the result to the recording medium;
    an inner decoder for correcting errors, within a range of error correction ability, in the data reproduced from the recording medium, adding an error flag to the errors outside the range of the error correction ability, and outputting a result;
    a frame de-interleaving means for detecting a corresponding field of data which is alternatively recorded in units of inner codes while divided into two fields and output from said inner decoder, and arranging units of inner codes of the field of data in units of fields; and
    an outer decoder for re-correcting errors in the data reproduced from the recording medium and output from said frame de-interleaving means to which an error flag is added.

2. The error correction apparatus as claimed in claim 1, wherein said frame interleaving means comprises:
    first and second frame memories for storing by frames data transmitted from said outer encoder;
    a first dividing means for dividing data by frames so that data output from said outer encoder is recorded by frames into said first and second frame memories;
    a first selecting means for alternately reading out data written into said first and second frame memories by inner codes;
    a first address generating means for supplying write and read addresses to said first and second frame memories;
    an index inserting means for inserting an index signal into output data of a frame memory selected by said first selecting means; and
    a first controlling means for controlling data writing and reading of said first and second frame memories, and also controlling generating addresses in said first address generating means.

3. The error correction apparatus as claimed in claim 2, wherein said first address generator means comprises:
    a first write address generator which increments a column address until one column address is equal to the length of an outer code and which increments a row address whenever said first write address generator is reset; and
    a first read address generator which increments a row address until the row address is equal to the length of an inner code, which increments a block address at an interval equal to twice the length of the inner codes, and which increments a column address whenever the block addresses are reset.

4. The error correction apparatus as claimed in claim 3, wherein said first write address generator comprises:
    a first column address generator for generating addresses corresponding to the length of an outer code; and
    a first row address generator for generating addresses corresponding to the length of an inner code.

5. The error correction apparatus as claimed in claim 4, wherein said first write address generator further comprises a first gating means for inputting a write column address reset signal and a write address reset signal supplied from said first controlling means to supply a signal reset after increasing addresses by the length of an outer code to said first column address generator.

6. The error correction apparatus as claimed in claim 5, wherein the write column address reset signal supplied from said first controlling means is reset every outer code, and the write address reset signal is reset every field.

7. The error correction apparatus as claimed in claim 3, wherein said first read address generator comprises:

a second row address generator for generating addresses corresponding to the length of an inner code;

a first block address generator for generating addresses which increase by one at an interval equal to twice the length of an inner code, said first block address generator being reset at an interval equal to a predetermined number of inner codes; and a second column address generator for generating addresses corresponding to the length of an outer code by increasing the address by one whenever said first block address generator is reset.

8. The error correction apparatus as claimed in claim 7, wherein said first address generator further comprises a second gating means for inputting a read row address reset signal and a read address reset signal which are supplied from said first controlling means so as to supply the reset signal which resets for the length of inner code to said second row address generator.

9. The error correction apparatus as claimed in claim 8, wherein the read row address reset signal supplied from said first controlling means is a signal which is reset every inner code, and the read address reset signal also supplied from said first controlling means is reset every frame.

10. The error correction apparatus as claimed in claim 3, wherein said first and second frame memories respectively comprise:

odd and even field memories for storing in an odd or even field one frame of data divided by said first dividing means;

a demultiplexer for controlling the storage of data divided by said dividing means into corresponding addresses of said odd and even field memories which are generated from said first write address generator of said first address generating means according to a field discriminating control signal output from said first control means; and a multiplexer for accessing data stored in said respective odd and even field memories according to the row, block and column of read addresses generated from said read address generator of said first address generating means, so as to alternately select the data of said odd or that of even memories according to a control signal output from said first controlling means.

11. The error correction apparatus as claimed in claim 10, further comprises a modulating means for modulating data transmitted from said inner encoder means to high-frequency components and recording them so as to compensate for the a high error rate of low-frequency data components.

12. The error correction apparatus as claimed in claim 11, wherein one frame of data output from said modulating means is recorded into eight tracks on said recording medium.

13. The error correction apparatus as claimed in claim 12, wherein control signals supplied to said respective multiplexers have a period equal to the inner code period, and signals of identical logic states are output when a track is changed, that is, when a final inner code of data of a track and an inner code of data located at a start point of a new track are read out.

14. The error correction apparatus as claimed in claim 1, wherein said frame de-interleaving means comprises:

third and fourth frame memories for storing by frames data transmitted from said inner decoder;

a second dividing means for dividing data by frames so that data output from said inner decoder is recorded by frames into said third and fourth frame memories;

a second selecting means for alternately reading out data recorded in said third and fourth frame memories by fields;

a second address generator means for supplying write and read addresses to said third and fourth frame memories;

a second controlling means for controlling data writing and reading of said third and fourth frame memories, and also address generating of said second address generating means.

15. The error correction apparatus as claimed in claim 14, wherein said second address generating means comprises:

a second write address generator wherein addresses are increased starting with the row addresses which end with an end point of a predetermined number of inner codes, block addresses are increased by one every two inner codes and column addresses are increased by one up to the length of an outer code whenever the block addresses are reset; and a second read address generator wherein addresses are increased starting with the column addresses which end with an outer code and said second address generator is reset by a read column address reset signal, and row addresses are increased by one whenever said second read address generator is reset.

16. The error correction apparatus as claimed in claim 15, wherein said second write address generator comprises:

a third row address generator for generating addresses corresponding to the length of an inner code by a predetermined number of inner codes;

a second block address generator for generating addresses which increase by one every two inner codes, being reset for a predetermined number of inner codes;

a third column address generator for generating addresses corresponding to the length of an outer code by increasing the address by one whenever said second block address generator is reset.

17. The error correction apparatus as claimed in claim 16, wherein said second write address generator further comprises a third gating means for inputting a read row address reset signal and a read address reset signal which are supplied from said second controlling means so as to supply the reset signal resetting said third gating means for the length of an inner code to said third row address generator.

18. The error correction apparatus as claimed in claim 17, wherein the write row address reset signal supplied from said second controlling means is a signal which is reset every inner code, and the write address reset signal is a signal which is reset every frame.

19. The error correction apparatus as claimed in claim 15, wherein said second read address generator comprises:

a fourth column address generator for generating addresses corresponding to the length of the outer code;

a fourth row address generator for generating addresses corresponding to the length of the inner code by a predetermined number of inner codes.

20. The error correction apparatus as claimed in claim 19, wherein said second read address generator further comprises a fourth gating means for receiving a read column address reset signal and a read address reset signal which are supplied from said second controlling means and supplying the reset signal to said fourth column address generator so as to be reset for every outer code block, and supplying the reset signal of said fourth column address generator to said fourth row address generator as a clock signal.

21. The error correction apparatus as claimed in claim 20, wherein the read column address reset signal supplied from said second controlling means is reset every outer code, and the read address reset signal is reset every field.

22. The error correction apparatus as claimed in claim 14, wherein each of said third and fourth frame memories comprise:
- odd and even field memories for storing in an odd or even field the interleaved data of one frame transmitted by said second dividing means;
- a demultiplexer for accessing said odd and even field memories according to write row and column addresses which are alternately generated from said second write address generator according to a control signal output from said second control means, and separately writing data of said dividing means in said odd and even field memories; and
- a multiplexer for accessing data stored in said odd and even field memories according to sequential row and column read addresses of one field generated from said second read address generator, so as to select said odd and even field memories according to a field discriminating control signal output from said second controlling means.

23. The error correction apparatus as claimed in claim 22, wherein a period of control signals supplied to said respective demultiplexers equals the inner code period, and signals of the same logic state are output when a track is changed, that is, when a final inner code of data of a track and an inner code of data located at the start point of a new track are read out.

24. The error correction apparatus as claimed in claim 1, further comprising:
- a modulating means for modulating data transmitted from said inner encoder means to high-frequency components and recording them so as to compensate for the high error rate of low-frequency data components; and
- a demodulating means for converting data recorded in said recording medium back into the original low-frequency band to transmit the converted data to said inner decoder.

25. An error correction method for use in a digital signal record/playback apparatus for recording compressed data on a recording medium and reproducing the recorded data from said recording medium, said method comprising the steps of:
(a) encoding data by adding horizontal parity data to compressed block data;
(b) interleaving a frame by alternately arranging two fields of data by inner codes from one frame of data which is encoded in said encoding step;
(c) adding vertical parity data to data from step (b) to transmit the data to a recording medium;
(d) correcting selected errors in data reproduced from a recording medium, and adding an error flag to data which is not corrected;
(e) arranging data read from the recording medium in units of fields; and
(f) correcting the errors in the data arranged in units of fields which contain error flags.

26. The error correction method as claimed in claim 25 further comprising the steps of:
(g) converting data transmitted from step (c) into high-frequency components and recording them so as to compensate for the high error rate of low-frequency data components; and
(h) converting data recorded in said recording medium back into the original low-frequency band so that the converted data can be corrected according to step (d).

* * * * *